United States Patent [19]

Imaoka et al.

[11] Patent Number: 5,825,080
[45] Date of Patent: Oct. 20, 1998

[54] SEMICONDUCTOR DEVICE PROVIDED WITH SURFACE GROUNDING CONDUCTOR FOR COVERING SURFACES OF ELECTRICALLY INSULATING FILMS

[75] Inventors: Toshikazu Imaoka, Hirakata; Nobuaki Imai, Yamatokouriyama, both of Japan

[73] Assignee: ATR Optical and Radio Communications Research Laboratories, Kyoto, Japan

[21] Appl. No.: 769,586

[22] Filed: Dec. 18, 1996

[30] Foreign Application Priority Data

Dec. 18, 1995 [JP] Japan ................................. 7-329057
Mar. 25, 1996 [JP] Japan ................................. 8-067898

[51] Int. Cl.$^6$ .................................................. H01L 23/552
[52] U.S. Cl. ........................ 257/659; 257/686; 257/700; 257/706; 257/276; 257/777
[58] Field of Search ............................. 257/659, 686, 257/700, 777, 706, 276, 660, 573

[56] References Cited

U.S. PATENT DOCUMENTS

| | | |
|---|---|---|
| 3,489,954 | 1/1970 | Thomas ................................. 257/659 |
| 3,533,023 | 10/1970 | Friend et al. .......................... 257/659 |
| 4,939,568 | 7/1990 | Kato et al. ............................. 257/686 |
| 5,311,059 | 5/1994 | Banerji et al. ......................... 257/659 |
| 5,401,687 | 3/1995 | Cole et al. ............................. 257/776 |
| 5,438,212 | 8/1995 | Okaniwa ............................... 257/276 |
| 5,721,454 | 2/1998 | Palmer ................................... 257/706 |

FOREIGN PATENT DOCUMENTS 63-156348 6/1988 Japan .

*Primary Examiner*—Olik Chaudhuri
*Assistant Examiner*—Phat X. Cao

[57] ABSTRACT

In a semiconductor device provided with a semiconductor substrate having two surfaces opposing to each other and having a circuit including a transistor having a plurality of electrodes, the circuit is formed on at least one of the two surfaces. Insulating films are formed on the two surfaces of the semiconductor substrate, respectively, and connecting electrodes are formed on a surface of the insulating film and electrically connected to the circuit. Further, a surface grounding conductor is formed on a surface of each of the insulating films so as to cover the surface of each of the insulating films except for portions where the connecting electrodes are formed. Accordingly, any possible interference of the circuit formed on the semiconductor device with the external circuit can be prevented.

5 Claims, 8 Drawing Sheets

First Modified Preferred Embodiment

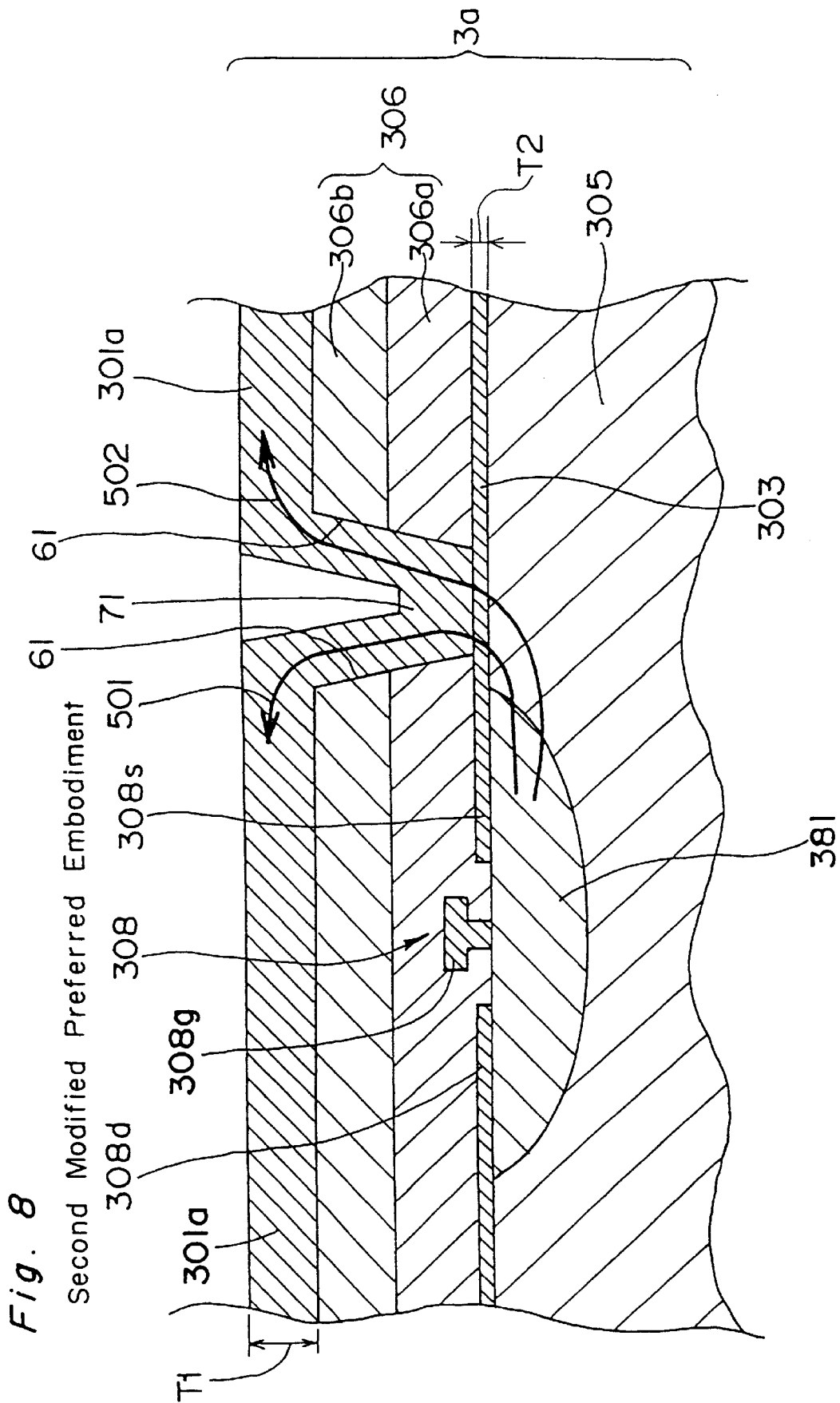
Fig. 8 Second Modified Preferred Embodiment

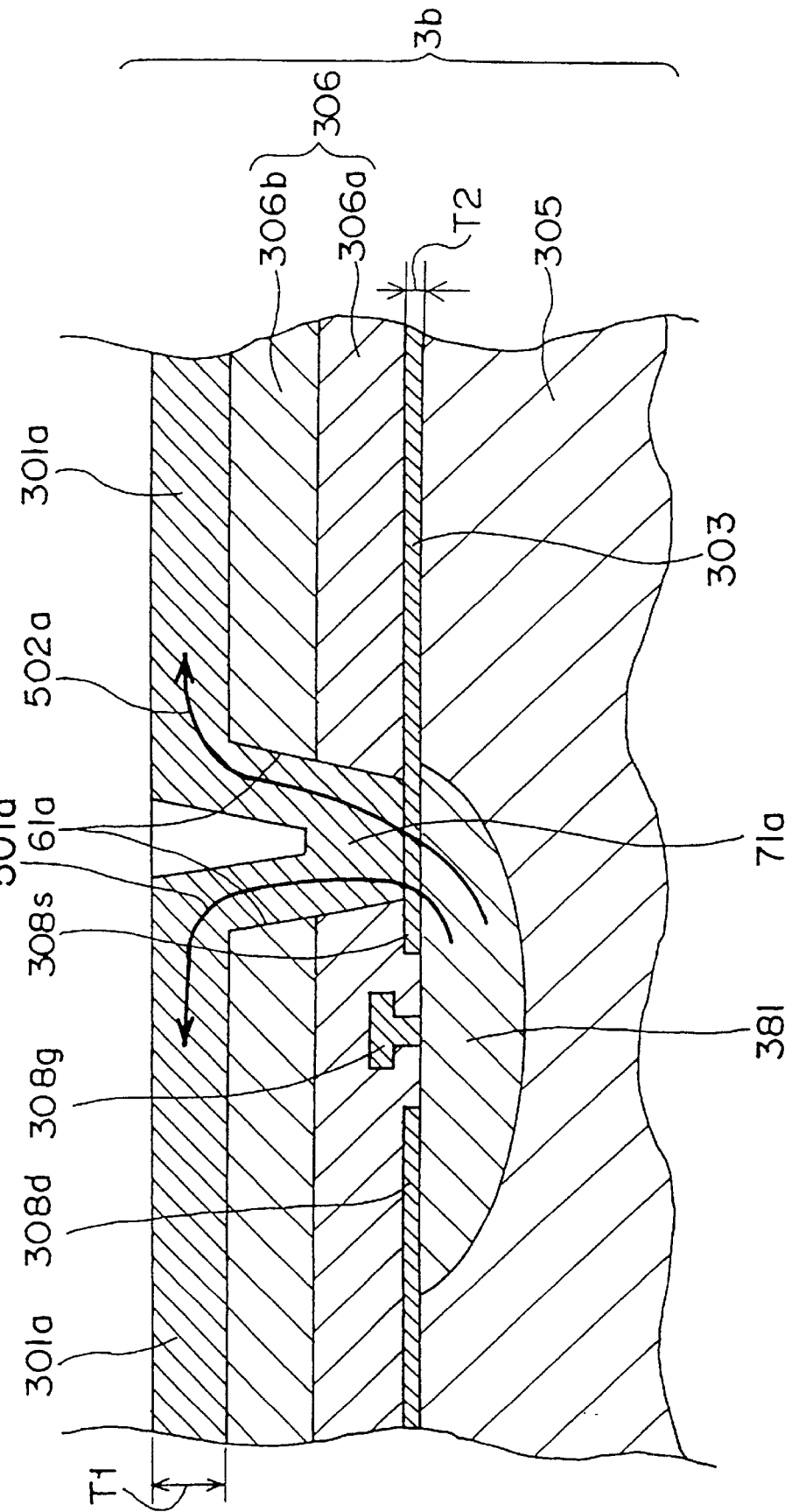
Fig. 9 Third Modified Preferred Embodiment

SEMICONDUCTOR DEVICE PROVIDED WITH SURFACE GROUNDING CONDUCTOR FOR COVERING SURFACES OF ELECTRICALLY INSULATING FILMS

BACKGROUND OF THE INVENTION

1. Field of the Invention

The present invention relates to a semiconductor device, and in particular, to a semiconductor device to be used at a high frequency, which is provided with a surface grounding electrical conductor for covering surface of electrically insulating films. In the specification, an electrical conductor is referred to as a conductor, and an electrically insulating conductor is referred to as an insulating conductor. Further, an electrically insulating layer is referred to as an insulating layer, and an electrically insulating film is referred to as an insulating film.

2. Description of the Prior Art

Conventionally, there has been an attempt at increasing the integration and mounting density of semiconductor devices by effecting fine processing and multi-layer wiring on one surface of a semiconductor substrate. In recent years, according to a growing demand for further increasing the integration and mounting density of semiconductor devices, there has been proposed a semiconductor device constructed by laminating semiconductor chips.

FIG. 6 is a longitudinal section view showing a prior art semiconductor device disclosed in Japanese Patent Laid-Open Publication No. 63-156348. The semiconductor device shown in FIG. 6 is constructed by laminating semiconductor chips 11-1 to 11-4 provided respectively with semiconductor devices 13-1 to 13-4. In the semiconductor chip 11-1, bumps 15-11 and 15-12 are formed on an upper surface 16-1 of a semiconductor substrate 14-1 provided with a semiconductor device 13-1, and the bumps 15-11 to 15-12 are electrically connected to the semiconductor device 13-1 by an internal wiring electrode (not shown) formed on the semiconductor substrate 14-1. Bumps 17-11 and 17-12 are formed on a lower surface 18-1 of the semiconductor substrate 14-1. Then, the bump 15-11 and the bump 17-11 are electrically connected with each other by an internal wiring electrode 20-11 formed in a through hole or via hole formed at the semiconductor substrate 14-1. Further, the bump 15-12 and the bump 17-12 are electrically connected with each other by an internal wiring electrode 20-12 formed in a through hole formed at the semiconductor substrate 14-1 and an internal wiring electrode 21-1 formed on the upper surface 16-1. An insulating layer 22-1 is formed on each of the upper surface 16-1 and the lower surface 18-1 of the semiconductor substrate 14-1.

The semiconductor chips 11-2 to 11-4 are constructed in a manner similar to that of the above-mentioned semiconductor chip 11-1. In the semiconductor chips 11-2 to 11-4 shown in FIG. 6, each of their portions corresponding to those of the semiconductor chip 11-1 is denoted with an identical reference numeral attached to the fore part preceding the hyphen (-). Then, the semiconductor chips 11-1 to 11-4 are stacked so as to be electrically connected with each other by bonding the counterpart bumps in a thermocompression bonding manner. By constructing the semiconductor device by laminating the semiconductor chips 11-1 to 11-4 in a manner as above, the integration and mounting density of the semiconductor device is contrived.

However, in the prior art semiconductor device, the electrode formed on the upper surface 16-1 of the semiconductor chip 11-1, the electrode formed on the upper surface 16-2 of the semiconductor chip 11-2 and the electrode formed on the upper surface 16-3 of the semiconductor chip 11-3 are electromagnetically coupled with the electrode formed on the lower surface 18-2 of the semiconductor chip 11-2, the electrode formed on the lower surface 18-3 of the semiconductor chip 11-3 and the electrode formed on the lower surface 18-4 of the semiconductor chip 11-4, respectively. Due to this coupling, the circuits constituted by the semiconductor chips 11-1 to 11-4 interfere with one another, and this has caused such a problem that the circuits do not normally operate. Furthermore, when the intervals between adjacent ones of the semiconductor chips 11-1 to 11-4 are widened in order to prevent the above-mentioned interference, the lengths of the bumps used for the connection between the semiconductor chips are increased. Consequently, the thickness of the semiconductor device cannot be reduced, and the inductance of the bumps of a parasitic component increases. This has caused such a problem that the circuit operating at a higher frequency does not normally operate and the circuit operating at a higher frequency cannot be constructed with a higher density.

SUMMARY OF THE INVENTION

An essential object of the present invention is therefore to provide a semiconductor device capable of preventing any possible interference of the circuits provided at a semiconductor chip with external circuits as compared with that in the prior art and constructing the circuit with a higher density.

Another object of the present invention is to a thin multi-layered type semiconductor device capable of preventing any possible interference of the circuits of multi-layered semiconductor chips and constructing a circuit which operates at a higher frequency with a higher density.

In order to achieve the above-mentioned objectives, according to one aspect of the present invention, there is provided a semiconductor device comprising:

a semiconductor substrate having two surfaces opposing to each other and having a circuit including a transistor having a plurality of electrodes, said circuit formed on at least one of said two surfaces;

insulating films respectively formed on said two surfaces of said semiconductor substrate;

connecting electrodes formed on a surface of said insulating film and electrically connected to said circuit; and a surface grounding conductor formed on a surface of each of said insulating films so as to cover the surface of each of said insulating films except for portions where said connecting electrodes are formed.

The above-mentioned semiconductor device preferably further comprises:

through holes respectively formed in said insulating films so as to penetrate said insulating films in a direction of thickness thereof;

through hole conductors respectively formed in said through holes; and an internal grounding conductor formed on the surface on which said circuit is formed so as to be located in a proximity of said transistor, wherein one electrode out of said plurality of electrodes of said transistor is electrically connected to said surface grounding conductor by way of said internal grounding conductor and said through hole conductor.

In the above-mentioned semiconductor device, each of said through hole conductor and said surface grounding conductor preferably has a thickness greater than a thickness of said internal grounding conductor.

The above-mentioned semiconductor device preferably further comprises:

through holes respectively formed in said insulating films so as to penetrate said insulating films in a direction of thickness thereof; and through hole conductors respectively formed in said through holes, wherein one electrode out of said plurality of electrodes of said transistor is electrically connected to said surface grounding conductor by way of said through hole conductor.

In the above-mentioned semiconductor device, each of said through hole conductor and said surface grounding conductor preferably has a thickness greater than a thickness of each of said plurality of electrodes of said transistor.

In the above-mentioned semiconductor device, each of said insulating films is preferably constructed by laminating a plurality of dielectric films, wherein an electrode constituting at least a part of said circuit including said transistor is disposed between said plurality of dielectric films, and wherein each of said connecting electrodes and said surface grounding conductor is disposed on a surface of a dielectric film located in an outermost position away from said semiconductor substrate out of said plurality of dielectric films.

In the above-mentioned semiconductor device, said circuit including said transistor is preferably formed on each of said two surfaces of said semiconductor substrate.

The above-mentioned semiconductor device preferably further comprises:

a further through hole formed in said semiconductor substrate so as to penetrate said semiconductor substrate in a direction of thickness of said semiconductor substrate; and a further through hole conductor formed in said further through hole, wherein respective ones of electrodes of said two circuits including said transistor formed on both surfaces of said semiconductor substrate are electrically connected to each other by way of said further through hole conductor.

According to a further aspect of the present invention, there is provided a multi-layered type semiconductor apparatus comprising a plurality of semiconductor devices, each of said semiconductor devices formed on a semiconductor substrate, said plurality of semiconductor devices laminated in a direction of thickness of each of said semiconductor substrates, wherein each of said plurality of semiconductor devices comprises:

said semiconductor substrate having two surfaces opposing to each other and having a circuit including a transistor having a plurality of electrodes, said circuit formed on at least one of said two surfaces;

insulating films respectively formed on said two surfaces of said semiconductor substrate;

connecting electrodes formed on a surface of said insulating film and electrically connected to said circuit; and a surface grounding conductor formed on a surface of each of said insulating films so as to cover the surface of each of said insulating films except for portions where said connecting electrodes are formed, wherein said multi-layered type semiconductor apparatus further comprises:

connection means for electrically connecting the surface grounding conductors of adjoining ones of said semiconductor devices with each other.

In the above-mentioned semiconductor apparatus, each of said semiconductor devices preferably further comprises:

through holes respectively formed in said insulating films so as to penetrate said insulating films in a direction of thickness thereof;

through hole conductors respectively formed in said through holes; and an internal grounding conductor formed on the surface on which said circuit is formed so as to be located in a proximity of said transistor, wherein one electrode out of said plurality of electrodes of said transistor is electrically connected to said surface grounding conductor by way of said internal grounding conductor and said through hole conductor.

In the above-mentioned semiconductor apparatus, each of said semiconductor device preferably further comprises:

through holes respectively formed in said insulating films so as to penetrate said insulating films in a direction of thickness thereof; and through hole conductors respectively formed in said through holes, wherein one electrode out of said plurality of electrodes of said transistor is electrically connected to said surface grounding conductor by way of said through hole conductor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 8 is a longitudinal section view showing a part of a semiconductor device according to a second modified preferred embodiment of the present invention; and FIG. 9 is a longitudinal section view showing a part of a semiconductor device according to a third modified preferred embodiment of the present invention.

DETAILED DESCRIPTION OF THE PREFERRED EMBODIMENTS

Preferred embodiments according to the present invention will be described below with reference to the attached drawings.

PREFERRED EMBODIMENT

Figure 1:
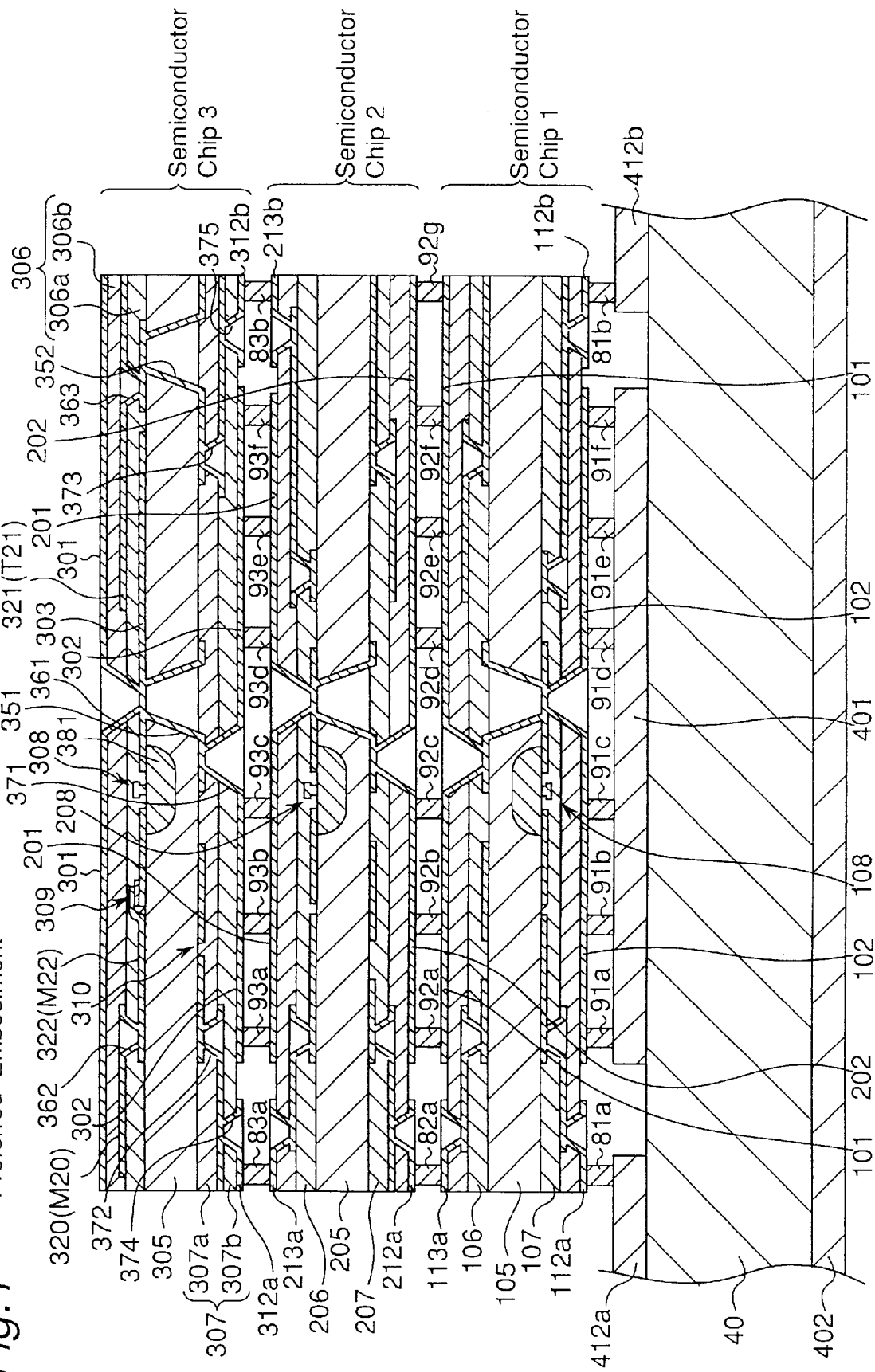
FIG. 1 is a longitudinal section view showing a semiconductor device formed on a mother board 40 according to a preferred embodiment of the present invention.

FIG. 1 is a longitudinal section view showing a semiconductor device formed on a mother board 40 according to a preferred embodiment of the present invention. As shown in FIG. 1, the semiconductor device of the present preferred embodiment is constructed by laminating three semiconductor chips 1, 2 and 3, where the semiconductor chips 1, 2 and 3 include grounding conductors 101, 201 and 301 formed on upper surfaces of insulating films 106, 206 and 306 and grounding conductors 102, 202 and 302 formed on lower surfaces of insulating films 107, 207 and 307, respectively.

A construction of the semiconductor device of the present preferred embodiment will be described below with reference to the accompanying drawings. First of all, the semiconductor chip 3 provided with a semi-insulating semiconductor substrate 305 will be described in detail with reference to FIG. 2. In the semiconductor chip 3, the semiconductor substrate 305 is made of, for example, GaAs, and an active layer 381 is formed in a predetermined portion on the upper surface of the semiconductor substrate 305. Then, a gate electrode 308g, a source electrode 308s and a drain electrode 308d are formed on the active layer 381, thereby forming a field-effect transistor 308 (referred to as a transistor 308 hereinafter) provided with the active layer 381, gate electrode 308g, source electrode 308s and drain electrode 308d. In the present case, the semiconductor substrate 305 may be implemented by a semiconductor substrate made of another material such as Si, and the transistor 308 may be implemented by another transistor such as a bipolar transistor.

Figure 2:
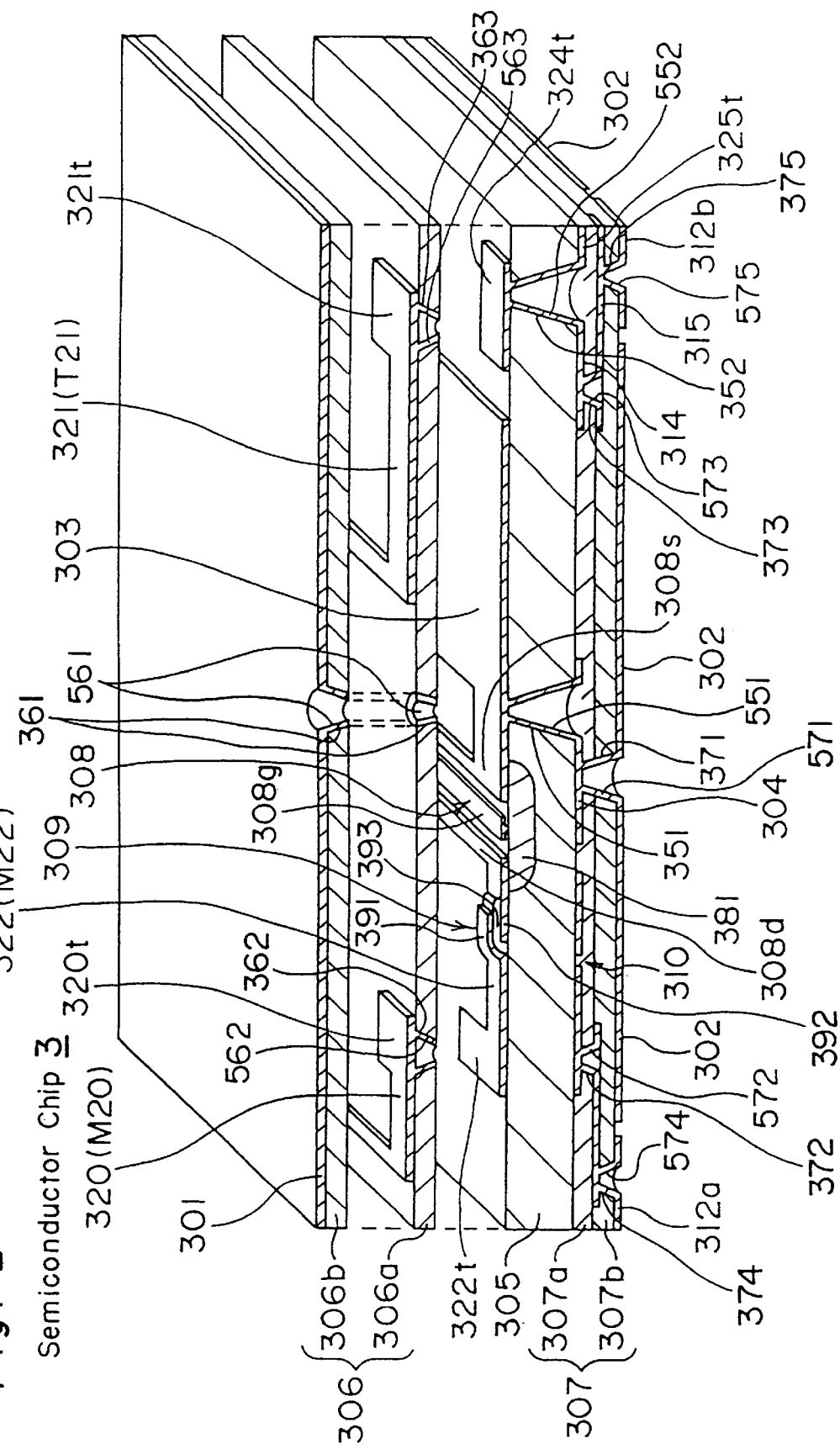
FIG. 2 is a partially exploded perspective view showing a part of a semiconductor chip 3 of FIG. 1.

Furthermore, the grounding conductor 303 is formed on the upper surface of the semiconductor substrate 305 so as to be electrically connected with the source electrode 308s of the transistor 308, while an MIM (Metal-Insulating-Metal) type capacitor 309 is formed on the upper surface of the semiconductor substrate 305 so as to be electrically connected with the drain electrode 308d of the transistor 308. In the present case, as shown in FIG. 2, the capacitor 309 is constituted by, for example, two electrodes 391 and 392 between which a dielectric film 393 is formed. In the present case, the electrode 392 of the capacitor 309 is electrically connected to the source electrode 308s of the transistor 308. Further, on the upper surface of the semiconductor substrate 305 is formed a strip conductor 322 so as to be electrically connected with the electrode 391 formed in an upper portion of the capacitor 309, thereby forming a connecting conductor 322t electrically connected with the strip conductor 322. Further, on the upper surface of the semiconductor substrate 305 is formed a connecting conductor 324t for connecting the triplate line T21 to an external connecting conductor 312b in a manner as described later.

A dielectric film 306a is formed on the upper surface of the semiconductor substrate 305 on which the transistor 308 and respective conductors are formed in a manner as described above. On the upper surface of the dielectric film 306a are formed a strip conductor 320 and a connecting conductor 320t electrically connected with the strip conductor 320 as well as a strip conductor 321 and a connecting conductor 321t electrically connected with the strip conductor 321. Further, a dielectric film 306b is formed on the upper surface of the dielectric film 306a on which the above-mentioned respective conductors are formed, while a grounding conductor 301 is formed on the entire upper surface of the dielectric film 306b. In the present case, the dielectric films 306a and 306b are made of, for example, polyimide. However, the present invention is not limited to this, and a dielectric film made of another material may be used.

Figure 5:
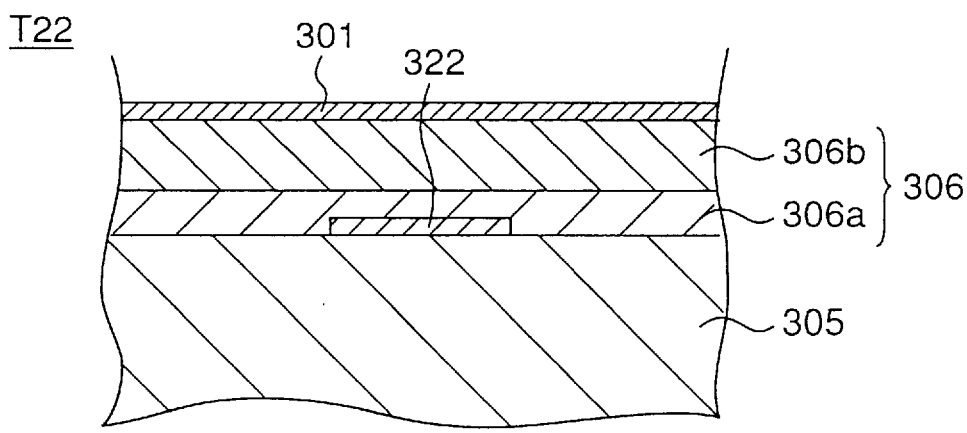
FIG. 5 is a longitudinal section view in a plane perpendicular to an upper and lower surfaces of an inverse microstrip line M22 of the semiconductor chip 3 of FIG. 1.
Figure 6:
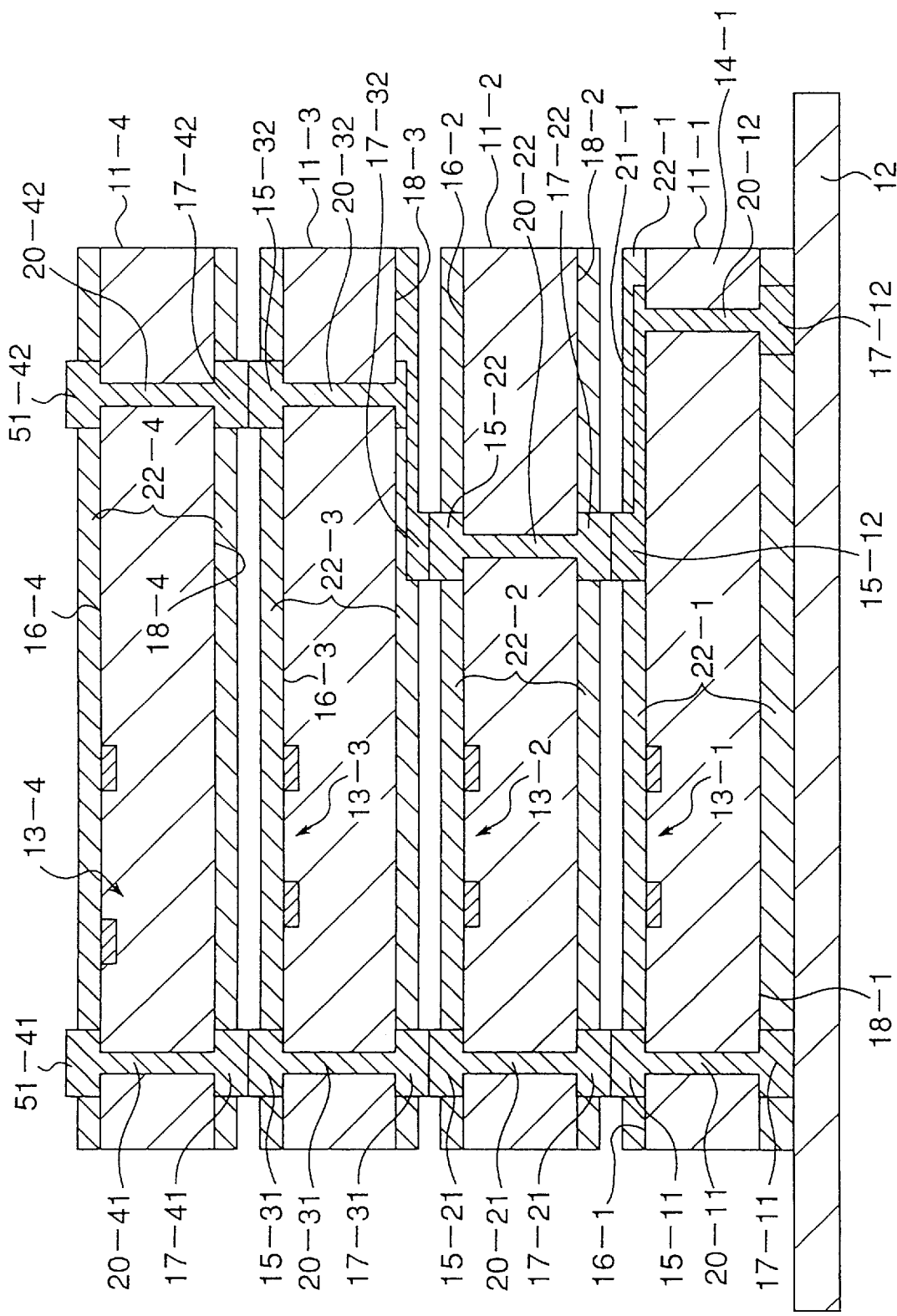
FIG. 6 is a longitudinal section view showing a prior art semiconductor device.

With the above-mentioned arrangement, an inverse microstrip line M20 is constructed by the strip conductor 320 and the grounding conductor 301 between which the dielectric film 306b is formed, and as shown in FIG. 5, an inverse microstrip line M22 is constructed by the strip conductor 322 and the grounding conductor 301, between which an insulating film 306 is formed, where the insulating film 306 comprises the dielectric film 306a and the dielectric film 306b. In the preferred embodiment, the insulating film 306 comprised of the dielectric film 306a and the dielectric film 306b is formed so as to have a thickness of about 10 μm (so we can call the same insulating film 306 an insulating thin film), and therefore, the strip conductors 321 and 322 are formed so as to be close enough to electromagnetically couple with the grounding conductor 301, then each of (a) a line comprised of the strip conductor 321 having a width of 10 to 30 μm and the grounding conductor 301, and (b) a line comprised of the strip conductor 322 having a width of 10 to 30 μm and the grounding conductor 301 operates as a microstrip line of a distributed constant transmission line. In this case, the grounding conductor 301 operates as a part of the transmission line and a shielding conductor for electromagnetically shielding the internal circuits and lines from electromagnetic wave from an external circuit.

Figure 4:
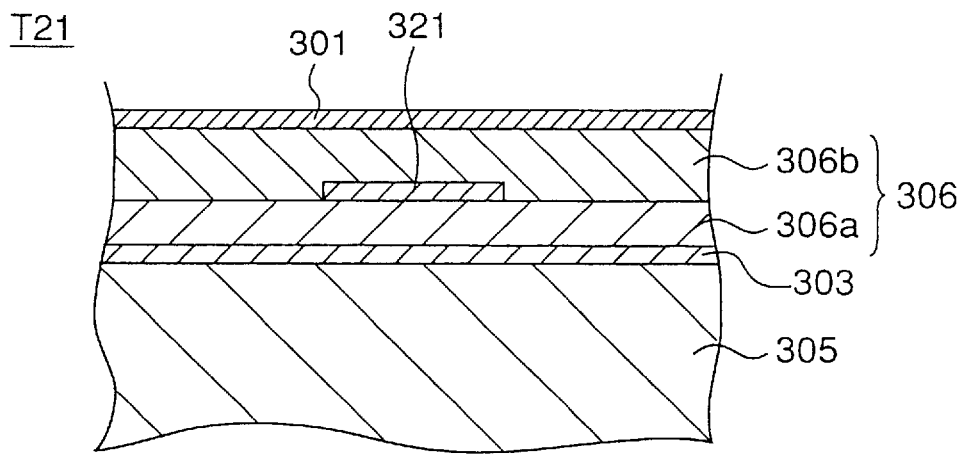
FIG. 4 is a longitudinal section view in a plane perpendicular to upper and lower surfaces of a triplate line T21 of the semiconductor chip 3 of FIG. 1.

As shown in FIG. 2, the inverse microstrip lines M20 and M22 are transmission lines in which the grounding conductor 301 is formed on the upper surface of the dielectric film 306b located in an outermost position away from the semiconductor substrate 305, and the strip conductors 320 and 322 are formed on the upper surface of the internal dielectric film 306a or on the upper surface of the semiconductor substrate 305. Further, as shown in FIG. 4, a triplate line T21 is constructed by the grounding conductor 301 and the grounding conductor 303 between which the strip conductor 321 is formed through the dielectric films 306a and 306b, respectively. In FIGS. 1 and 2, the reference numerals of the inverse microstrip lines M20 and M22 and the triplate line T21 are shown within parentheses following the reference numerals of the strip conductors 320, 322 and 321.

In the present case, as shown in FIG. 2, the connecting conductor 320t is electrically connected to the connecting conductor 322t by a through hole conductor 562 formed in a through hole 362 formed at the dielectric film 306a, thereby connecting the inverse microstrip line M20 with the inverse microstrip line M22. Further, the connecting conductor 321t is electrically connected to the connecting conductor 324t formed on the upper surface of the semiconductor substrate 305 by a through hole 563 formed in a through hole 363 formed at the dielectric film 306a, and the connecting conductor 324t is electrically connected to the external connecting conductor 312b as described in detail later, thereby connecting the triplate line T21 to the external connecting conductor 312b. Further, the grounding conductor 303 formed on the upper surface of the semiconductor substrate 305 is electrically connected to the grounding conductor 301 formed on the upper surface of the insulating film 306 by a through hole conductor 561 formed in a through hole 361 formed at the insulating film 306.

Figure 3:
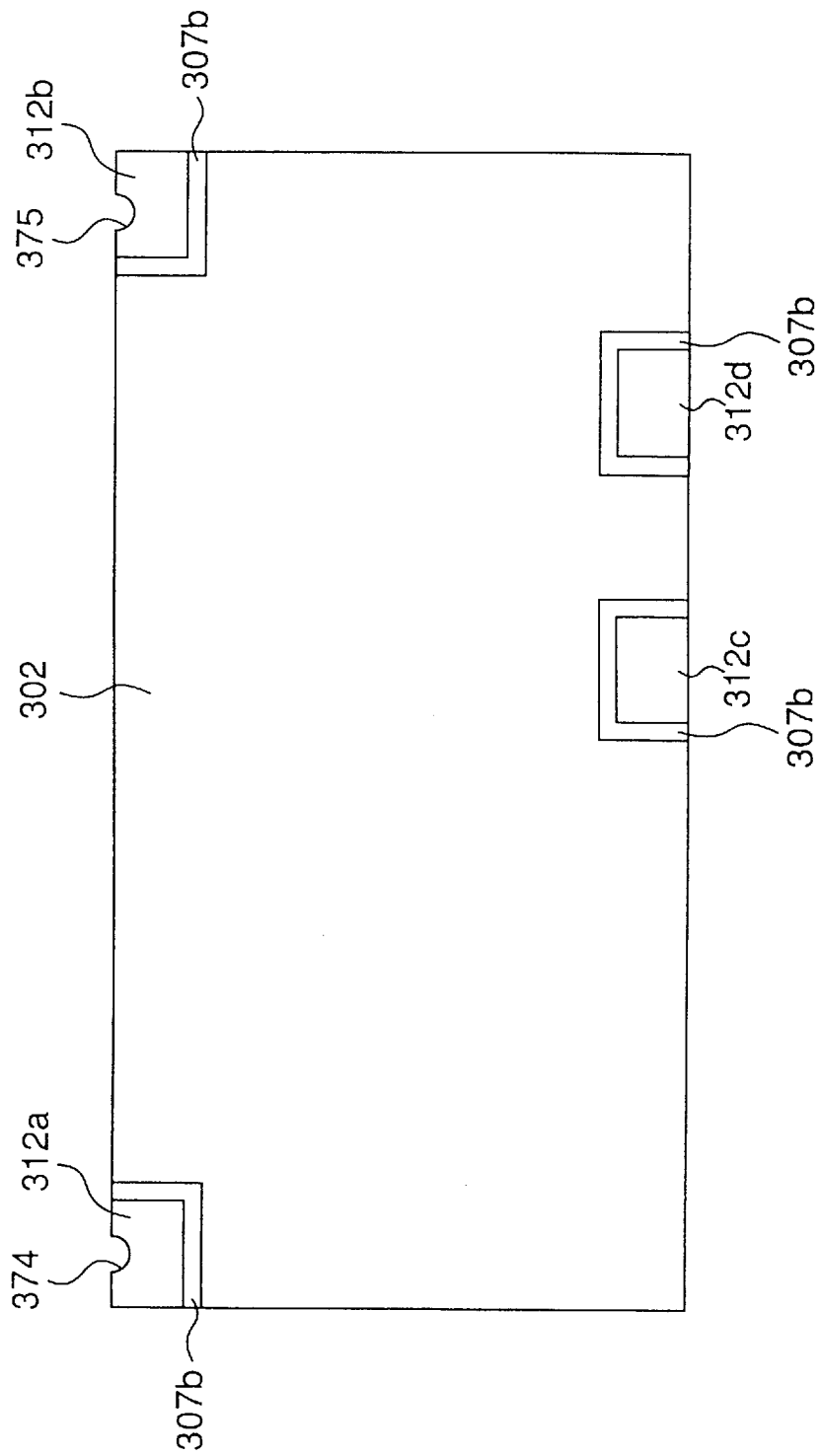
FIG. 3 is a plan view showing the semiconductor chip 3 of FIG. 1 viewed from a bottom of the chip 3.

In a manner as described above, a circuit comprised of the transistor 308, capacitor 309, inverse microstrip lines M20 and M22 and triplate line T21 is formed on the upper surface of the semiconductor substrate 305. In a manner similar to the above, a capacitor 310, a grounding conductor 304, a connecting conductor 325t and so forth are formed on the lower surface of the semiconductor substrate 305, while a dielectric film 307a is formed on the lower surface of the semiconductor substrate 305. Further, a grounding conductor, a connecting conductor 315 and so forth are formed on the lower surface of the dielectric film 307a, while a dielectric film 307b is formed on the lower surface of the dielectric film 307a. Then, on the lower surface of the dielectric film 307b, there are formed external connecting conductors 312a, 312b, 312c and 312d and a grounding conductor 302 as shown in FIGS. 2 and 3. In the present case, as shown in FIG. 3, the grounding conductor 302 is formed so that it covers the lower surface of the dielectric film 307b except for the portions where the external connecting conductors 312a, 312b, 312c and 312d are formed.

In the present case, the connecting conductor 324t is electrically connected to the connecting conductor 325t formed on the lower surface of the semiconductor substrate 305 by a through hole conductor 552 formed in a through hole 352 formed at the semiconductor substrate 305 as shown in FIG. 2. The connecting conductor 325t is electrically connected to the external connecting conductor 312b by way of a through hole conductor 573 in a through hole 373 formed at the dielectric film 307a, the connecting conductor 315 formed between the dielectric film 307a and the dielectric film 307b and a through hole conductor 575 formed in a through hole 375 formed at the dielectric film 307b. With this arrangement, the triplate line T21 electrically connected to the connecting conductor 324t is electrically connected to the external connecting conductor 312b.

The grounding conductor 303 formed on the upper surface of the semiconductor substrate 305 is electrically connected to the grounding conductor 304 formed on the lower surface of the semiconductor substrate 305 by a through hole conductor 551 formed in a through hole 351 formed at the semiconductor substrate 305. The grounding conductor 304 is electrically connected to the grounding conductor 302 by a through hole conductor 571 formed in a through hole 371 formed so as to penetrate an insulating film 307 comprising the dielectric film 307a and the dielectric film 307b. With the above-mentioned arrangement, a semiconductor chip 3 provided with a circuit which includes the transistor 308 and performs a predetermined operation is constructed.

Semiconductor chips 1 and 2 are constructed in a manner similar to that of the semiconductor chip 3. That is, as shown in FIG. 1, the semiconductor chip 1 comprises a transistor 108 formed on the lower surface of a semiconductor substrate 105, respective conductors formed on the upper surface and the lower surface of the semiconductor substrate 105, insulating films 106 and 107 each comprising two dielectric films (not shown) and a conductor formed between the two dielectric films of the insulating films 106 and 107, thereby forming a predetermined circuit including the transistor 108. Then, an external connecting conductor 113a electrically connected with the circuit including the transistor 108 is formed on the upper surface of the insulating film 106, and the grounding conductor 101 is formed so as to cover the upper surface of the insulating film 106 except for the portion where the external connecting conductor 113a is formed. On the lower surface of the insulating film 107 are formed external connecting conductors 112a and 112b electrically connected with the circuit including the transistor 108, and the grounding conductor 102 is formed so as to cover the lower surface of the insulating film 107 except for the portions where the external connecting conductors 112a and 112b are formed.

The semiconductor chip 2 comprises a transistor 208 formed on the upper surface of a semiconductor substrate 205, respective conductors formed on the upper surface and the lower surface of the semiconductor substrate 205, insulating films 206 and 207 each comprising two dielectric films and a conductor formed between the two dielectric films (not shown) of the insulating films 206 and 207, thereby forming a predetermined circuit including the transistor 208. Then, external connecting conductors 213a and 213b electrically connected with the circuit including the transistor 108 are formed on the upper surface of the insulating film 206, and a grounding conductor 201 is formed so as to cover the upper surface of the insulating film 206 except for the portions where the external connecting conductors 213a and 213b are formed. Further, an external connecting conductor 212a is formed on the lower surface of an insulating film 207, and a grounding conductor 202 is formed so that it covers the lower surface of the insulating film 207 except for the portion where the external connecting conductor 212a is formed.

The semiconductor chips 1, 2 and 3 constructed in a manner as described above are electrically connected to one another to be multi-layered on the upper surface of the mother board 40. In the present case, the mother board 40 is made of, for example, alumina. Lead conductors 412a and 412b and a grounding conductor 401 are formed on the upper surface of the mother board 40, while a grounding conductor 402 is formed on the lower surface of the mother board 40. The semiconductor chip 1 is provided so that at least a part of the external connecting conductor 112a of the semiconductor chip 1 is arranged so as to oppose to the lead conductor 412a of the mother board 40, at least a part of the external connecting conductor 112b of the semiconductor chip 1 is arranged so as to oppose to the lead conductor 412b of the mother board 40, and the grounding conductor 102 of the semiconductor chip 1 is arranged so as to oppose to the grounding conductor 401 of the mother board 40. Then, the external connecting conductor 112a of the semiconductor chip 1 is electrically connected to the lead conductor 412a of the mother board 40 by a bump 81a, while the external connecting conductor 112b of the semiconductor chip 1 is electrically connected to the lead conductor 412b of the mother board 40 by a bump 81b. Further, the grounding conductor 102 of the semiconductor chip 1 is electrically connected to the grounding conductor 401 of the mother board 40 by bumps 91a to 91f.

In the present case, each of the bumps 81a, 81b and 91a to 91f is made of, for example, Au. Then, the bump 81a is integrally formed by bonding a bump formed on the external connecting conductor 112a to a bump formed on the lead conductor 412a in a thermocompression bonding manner. The external connecting conductor 112a is electrically connected to the lead conductor 412a, and the semiconductor chip 1 is fixed on the mother board 40. Using a manner similar to that as described above, there are formed the bumps 81b and 91a to 91f and bumps to be used for connecting each conductor of the semiconductor chip 2 to each conductor of the semiconductor chip 1 and connecting each conductor of the semiconductor chip 3 to each conductor of the semiconductor chip 2 as described later. In the present case, the semiconductor chip 1 is fixed on the mother board 40 so as to be put apart from the board by the height of the bumps 81a, 81b and 91a to 91f.

The semiconductor chip 2 is provided to be superposed on the semiconductor chip 1 so that the external connecting conductor 113a of the semiconductor chip 1 and the external connecting conductor 212a of the semiconductor chip 2 are arranged so as to oppose to each other and the grounding conductor 101 and the grounding conductor 202 are arranged so as to oppose to each other. Then, the external connecting conductor 113a and the external connecting conductor 212a are electrically connected with each other by a bump 82a, while the grounding conductor 101 and the grounding conductor 202 are electrically connected with each other by bumps 92a to 92g. The semiconductor chip 2 is fixed on the semiconductor chip 1 so as to be put apart from the board by the height of the bumps 82a and 92a to 92g.

The semiconductor chip 3 is provided to be superposed on the semiconductor chip 2 so that the external connecting conductor 213a of the semiconductor chip 2 and the external connecting conductor 312a of the semiconductor chip 3 are arranged so as to oppose to each other, the external connecting conductor 213b of the semiconductor chip 2 and the external connecting conductor 312b of the semiconductor chip 3 are arranged so as to oppose to each other, and the grounding conductor 201 and the grounding conductor 302 are arranged so as to oppose to each other. Then, the external connecting conductor 213a and the external connecting conductor 312a are electrically connected with each other by a bump 83a, while the external connecting conductor 213b and the external connecting conductor 312b are electrically connected with each other by a bump 83b. Further, the grounding conductor 201 and the grounding conductor 302 are electrically connected with each other by bumps 93a to 93f. Thus, the semiconductor chip 3 is fixed on the semiconductor chip 2 so as to be put apart from the chip by a height of the bumps 83a, 83b and 93a to 93f by the bumps 83a, 83b and 93a to 93f. In a manner as described above, the semiconductor device of the present preferred embodiment in which the semiconductor chips 1, 2 and 3 are multi-layered is formed on the mother board 40.

In the semiconductor device of the present preferred embodiment according to the present invention constructed as above, the semiconductor chips 1, 2 and 3 are provided with the grounding conductors 101 and 102, the grounding conductors 201 and 202 and the grounding conductors 301 and 302, respectively. With this arrangement, the respective conductors formed on the upper surface of the semiconductor substrate 105 or the respective conductors formed between the two dielectric films of the insulating film 106 can be prevented from being electromagnetically coupled with the respective conductors formed on the lower surface of the semiconductor substrate 205 or the respective conductors formed between the two dielectric films of the insulating film 207 when the semiconductor chips 1, 2 and 3 are multi-layered. Furthermore, the conductor formed on the upper surface of the semiconductor substrate 205 or the conductor provided between the two dielectric films of the insulating film 206 can be prevented from being electromagnetically coupled with the conductor formed on the lower surface of the semiconductor substrate 305 or the conductor provided between the two dielectric films 307a and 307b. Therefore, any possible interference of the circuit provided at the semiconductor chip 1 with the circuit provided at the semiconductor chip 2 as well as any possible interference of the circuit provided at the semiconductor chip 2 with the circuit provided at the semiconductor chip 3 can be prevented, thereby allowing the chips to be multi-layered so that any correct operations of the circuits are not hindered.

Furthermore, in the semiconductor device of the present preferred embodiment constructed as above, any possible interference of the circuits provided at the semiconductor chips 1, 2 and 3 are prevented by forming the semiconductor chips 1, 2 and 3 with the grounding conductors 101 and 102, the grounding conductors 201 and 202 and the grounding conductors 301 and 302. Therefore, the respective intervals between the semiconductor chips can be sufficiently narrowed. With this arrangement, the lengths of the bumps 82a, 83a and 83b in the direction of height can be sufficiently reduced. Therefore, the inductance of each of the bumps 82a, 83a and 83b, which is a parasitic inductance, can be remarkably reduced, thereby allowing the lamination to be achieved without hindering any correct operations of the circuits and allowing the semiconductor device to be reduced in thickness.

Furthermore, in the semiconductor device of the present preferred embodiment constructed as above, the grounding conductors 101, 102, 201, 202, 301 and 302 are formed widely so as to cover the insulating films 106, 107, 206, 207, 306 and 307, respectively. Then, the connection between the grounding conductor 102 of the semiconductor chip 1 and the grounding conductor 401 of the mother board 40, the connection between the grounding conductor 101 of the semiconductor chip 1 and the grounding conductor 202 of the semiconductor chip 2, and the connection between the grounding conductor 201 of the semiconductor chip 2 and the grounding conductor 302 of the semiconductor chip 3 are achieved by a plurality of bumps 91a to 91f, the bumps 92a to 92g and the bumps 93a to 93f, respectively. With this arrangement, the grounding impedance between the grounding conductor 102 of the semiconductor chip 1 and the grounding conductor 401 of the mother board 40, the grounding impedance between the grounding conductor 101 of the semiconductor chip 1 and the grounding conductor 202 of the semiconductor chip 2, and the grounding impedance between the grounding conductor 201 of the semiconductor chip 2 and the grounding conductor 302 of the semiconductor chip 3 can be reduced. Therefore, the grounding impedance between the grounding conductor 401 of the mother board 40 and the grounding conductors 101, 102, 201, 202, 301 and 302 of the semiconductor chips 1, 2 and 3 can be reduced, so that the semiconductor chips 1, 2 and 3 can be multi-layered without hindering any correct operations of the circuits formed in the semiconductor chips 1, 2 and 3.

Furthermore, according to the semiconductor device of the present preferred embodiment constructed as above, the inductance of each of the bumps 82a, 83a and 83b, which is a parasitic inductance, can be remarkably reduced and the grounding impedance can be reduced as described above. Therefore, either an analog circuit which operates at a higher frequency or a high speed digital circuit can be multi-layered, so that the resulting integrated circuit can be formed with a higher density.

Furthermore, the semiconductor chips 1, 2 and 3 of the semiconductor device of the present preferred embodiment are provided with the grounding conductors 101 and 102, the grounding conductors 201 and 202 and the grounding conductors 301 and 302, respectively. Therefore, even when the semiconductor chips 1, 2 and 3 are used singly, any possible interference of the circuits provided at the semiconductor chips 1, 2 and 3 with the external circuits can be prevented.

Furthermore, in the semiconductor device of the present preferred embodiment, the semiconductor chips 1, 2 and 3 may be selected by inspecting whether or not the semiconductor chips 1, 2 and 3 normally operate before the semiconductor chips 1, 2 and 3 are multi-layered and by using only those which operate normally for the lamination. With this arrangement, an increased yield can be assured when producing the semiconductor devices of the present preferred embodiment.

Furthermore, in the semiconductor device of the present preferred embodiment, heat generated from the transistors 108, 208 and 308 formed at the semiconductor chips 1, 2 and 3 is transmitted to the grounding conductors 102, 201 and 301 through the insulating films 107, 206 and 306 and then discharged outwardly of the semiconductor device. That is, the grounding conductors 102, 201 and 301 operate respectively as heat radiating plates, and therefore, the possible temperature rise in the active layers of the transistors 108, 208 and 308 can be prevented. With this arrangement, the electric characteristics of the transistors 108, 208 and 308 can be prevented from deteriorating, thereby allowing the semiconductor device to have an increased operating life.

Modified preferred embodiments according to the present invention will be described next with reference to the accompanying drawings.

FIRST MODIFIED PREFERRED EMBODIMENT

Figure 7:
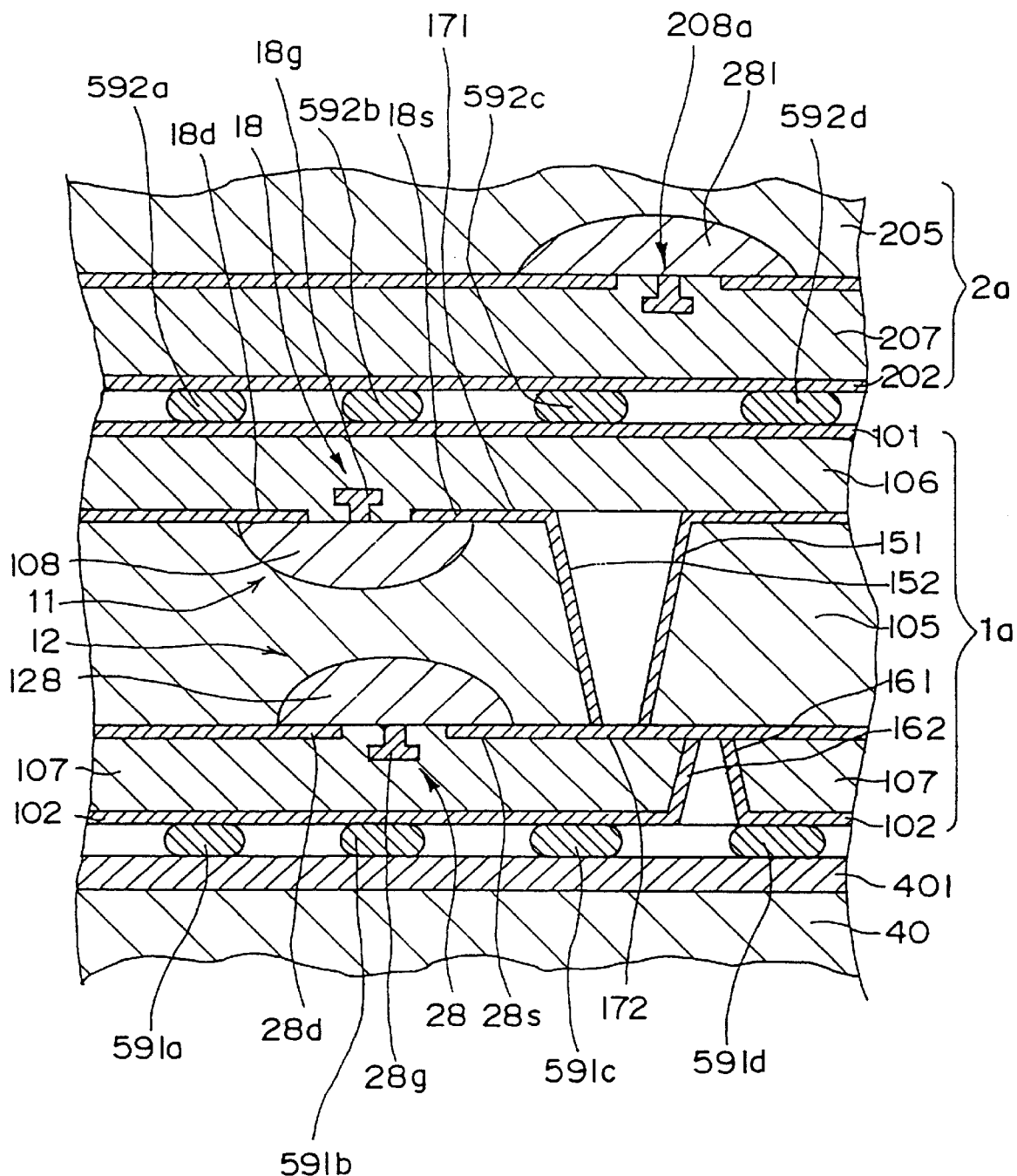
FIG. 7 is a longitudinal section view showing a part of a semiconductor device according to a first modified preferred embodiment of the present invention.

FIG. 7 is a longitudinal section view showing a part of a semiconductor device according to a first modified preferred embodiment of the present invention. The semiconductor device of the first modified preferred embodiment shown in FIG. 7 is constructed by laminating a plurality of semiconductor chips including semiconductor chips 1*a* and 2*a* on a mother board 40 in a manner similar to that of the first preferred embodiment shown in FIG. 1, and the same components as those shown in FIG. 1 are denoted by the same reference numerals in FIG. 7. In the present case, the semiconductor device of the first modified preferred embodiment is characterized in that a through hole 151 which penetrates the semiconductor substrate 105 of the semiconductor chips 1*a* is formed in the direction of thickness, and a source electrode 18*s* of a transistor 18 formed on the upper surface of the semiconductor substrate 105 is electrically connected to a source electrode 28*s* of a transistor 28 formed on the lower surface of the semiconductor substrate 105 by a through hole conductor 152 formed in the through hole 151, thereby connecting a first circuit 11 including the transistor 18 with a second circuit 12 including the transistor 28.

A construction of the semiconductor device of the first modified preferred embodiment will be described in detail below with reference to FIG. 7. The semiconductor substrate 105 is provided with the through hole 151 which penetrates the substrate in the direction of thickness, and an active layer 108 is formed on the upper surface of the semiconductor substrate 105. On the active layer 118 are formed a gate electrode 18*g*, a drain electrode 18*d* and the source electrode 18*s* so as to form the transistor 18. Further, on the upper surface of the semiconductor substrate 105 are formed elements or devices such as resistors (not shown) and capacitors (not shown) and electrodes so that they perform a predetermined operation including the transistor 18, thereby forming the first circuit 11. Furthermore, an active layer 128 is formed on the lower surface of the semiconductor substrate 105, while a gate electrode 28*g*, a drain electrode 28*d* and the source electrode 28*s* are formed on the active layer 128 to form the transistor 28. Further, on the lower surface of the semiconductor substrate 105 are formed elements such as resistors (not shown) and capacitors (not shown) and electrodes so that they perform a predetermined operation including the transistor 28, thereby forming the second circuit 12.

In the present case, according to the first modified preferred embodiment, as shown in FIG. 7, a grounding conductor 171 is formed on the upper surface of the semiconductor substrate 105 so as to be electrically connected with the source electrode 18*s* of the transistor 18, while a grounding conductor 172 is formed on the lower surface of the semiconductor substrate 105 so as to be electrically connected with the source electrode 28*s* of the transistor 28. Then, the grounding conductor 171 and the grounding conductor 172 are electrically connected with each other by the through hole conductor 152 formed in the through hole 151, thereby connecting the first circuit 11 with the second circuit 12. That is, the source electrode 18*s* of the transistor 18 and the source electrode 28*s* of the transistor 28 are electrically connected with each other by way of the grounding conductor 171, the through hole conductor 152 and the grounding conductor 172. Therefore, for example, by connecting the grounding conductor 172 to the grounding conductor 102 by way of a through hole conductor 162 as described later and connecting a predetermined element to the first and second circuits 11 and 12, a push-pull amplifier can be constructed.

On the other hand, an insulating film 106 is formed on the upper surface of the semiconductor substrate 105 on which the first circuit 11 is formed and a grounding conductor 101 is formed on the upper surface of the insulating film 106 in a manner similar to that of the preferred embodiment shown in FIG. 1. Further, an insulating film 107 is formed on the lower surface of the semiconductor substrate 105 on which the second circuit 12 is formed and a grounding conductor 102 is formed on the lower surface of the insulating film 107 in a manner similar to that of the preferred embodiment shown in FIG. 1. In the present case, the grounding conductor 172 and the grounding conductor 102 are electrically connected with each other by way of a through hole conductor 152 formed in a through hole 161 formed at the insulating film 107.

The semiconductor chip 1a constructed as above is placed in a predetermined position on the upper surface of the mother board 40 on which the grounding conductor 401 is formed, and the grounding conductor 102 of the semiconductor chip 1*a* and the grounding conductor 401 of the mother board 40 are electrically connected with each other by means of bumps 591*a*, 591*b*, 591*c* and 591*d*. On the upper surface of the semiconductor chip 1*a* is mounted a semiconductor chip 2*a* which is constructed in a manner similar to that of the semiconductor chip 1*a* and provided with a transistor 208*a*. The grounding conductor 101 of the semiconductor chip 1*a* and the grounding conductor 202 of the semiconductor chip 2*a* are electrically connected with each other by means of bumps 592*a*, 592*b*, 592*c* and 592*d*. In the present case, the transistor 208*a* is formed on an active layer 281 formed on the lower surface of the semiconductor substrate 205 in a manner similar to that of the transistors 18 and 28.

In a manner as described above, there is constructed the semiconductor device of the first modified preferred embodiment in which a plurality of semiconductor chips including the semiconductor chips 1*a* and 2*a* are provided on the mother board 40.

In the semiconductor device of the first modified preferred embodiment constructed as above, the semiconductor chip 1*a* is constructed by forming the insulating film 107 on the second circuit 12 including the transistor 28 formed on the lower surface of the semiconductor substrate 105, forming the grounding conductor 102 on the lower surface of the insulating film 107, and connecting the grounding conductor 102 to the grounding conductor 401 of the mother board 40. With this arrangement, the electrode of the second circuit 12 can be prevented from being put in contact with the grounding conductor 401. Therefore, the second circuit 12 can be also formed on the lower surface of the semiconductor substrate 105, thereby allowing a higher density circuit to be formed in comparison with the prior art semiconductor chip which can form a circuit only on its one surface (or upper surface).

In the semiconductor device of the first modified preferred embodiment constructed as above, the semiconductor chip 1a is capable of connecting the first circuit 11 formed on the upper surface of the semiconductor substrate 105 with the second circuit 12 formed on the lower surface of the semiconductor substrate 105 by the through hole conductor 152 formed in the through hole 151 formed at the semiconductor substrate 105. Therefore, the first circuit 11 and the second circuit 12 can be electrically connected with each other easily in an arbitrary position.

According to the semiconductor device of the first modified preferred embodiment, a circuit may be constructed including a transistor on both surfaces of the semiconductor substrate in a manner similar to that of the semiconductor chip 1a with regard to all the semiconductor chips including the semiconductor chips 1a and 2a or the circuit may be formed on both surfaces of at least one semiconductor chip out of the semiconductor chips to be multi-layered.

Furthermore, in the first modified preferred embodiment, the grounding conductor 171 and the grounding conductor 172 are electrically connected with each other by the through hole conductor 152 so as to electrically connect the first circuit 11 with the second circuit 12. However, the present invention is not limited to this, and the electrode of the first circuit 11 except for the grounding conductor 171 and the electrode of the second circuit 12 except for the grounding conductor 172 may be electrically connected with each other by the through hole conductor 152 so as to electrically connect the first circuit 11 with the second circuit 12.

SECOND MODIFIED PREFERRED EMBODIMENT

FIG. 8 is a sectional view showing a part of a semiconductor device according to a second modified preferred embodiment of the present invention. FIG. 8 shows a section of a part of a semiconductor chip 3a located in an uppermost layer of the semiconductor chips multi-layered on the mother board 40. The semiconductor device of the second modified preferred embodiment is constructed in a manner similar to that of the semiconductor device shown in FIG. 1 except for the provision of the semiconductor chip 3a in place of the semiconductor chip 3 of the semiconductor device shown in FIG. 1. Further, in FIG. 8, the same components as those shown in FIGS. 1 and 2 are denoted by the same reference numerals. In the semiconductor device of the second modified preferred embodiment, the semiconductor chip 3a differs from the semiconductor chip 3 of the preferred embodiment shown in FIG. 1 in the following points (1) to (3).

(1) In place of the grounding conductor 301 shown in FIG. 1, a grounding conductor 301a which is sufficiently thicker than the grounding conductor 301 is formed.

(2) In the proximity of the transistor 308, a through hole 61 which penetrates the insulating film 306 is formed.

(3) In the through hole 61, a through hole conductor 71 for connecting the grounding conductor 303 formed on the semiconductor substrate 305 with the grounding conductor 301a formed on the upper surface of the insulating film 306 is formed. In the present case, the through hole conductor 71 is has a sufficient thickness greater than those of the grounding conductor 303 and the grounding conductor 301 shown in FIG. 1.

In the semiconductor chip 3a of the second modified preferred embodiment, the thickness T2 of the grounding conductor 303 is set to, for example, 1 $\mu$m, while the thickness T1 of the grounding conductor 301a and the thickness of the through hole conductor 71 are each set to, for example, 10 $\mu$m. Further, the through hole 61 is arranged in the proximity of the transistor 308 in, for example, a position apart from the transistor 308 by a distance of 100 $\mu$m or 200 $\mu$m so that heat generated at the active layer 381 can be easily transmitted to the grounding conductor 301a by way of the through hole conductor 71.

In the semiconductor chip 3a of the semiconductor device of the second modified preferred embodiment constructed as above, the heat generated at the active layer 381 between the drain electrode 308d and the source electrode 308s of the transistor 308 is transmitted to the grounding conductor 301a formed widely and thickly so as to cover the insulating film 306 by way of the inside of the semiconductor substrate 305, the grounding conductor 303 and the through hole conductor 71 as indicated by the arrows denoted by the reference numerals 501 and 502 in FIG. 8, and then discharged. In the present case, the through hole conductor 71 is formed thickly in the through hole 61 located in the proximity of the transistor 308. Therefore, the heat generated at the active layer 381 is efficiently transmitted to the grounding conductor 301a, and then efficiently discharged by the grounding conductor 301a formed thickly. By this operation, the heat generated at the transistor 308 can be efficiently discharged outwardly of the semiconductor device. Therefore, the semiconductor device of the second modified preferred embodiment can suppress the temperature rise of the transistor 308 in operation as compared with that of the semiconductor device of the preferred embodiment shown in FIG. 1. Therefore, any possible variation of the characteristics of the transistor 308 due to the heat can be suppressed. Furthermore, a circuit which handles a great power and is accompanied by a great amount of heat generated at the transistor, and the operating life of the transistor can be increased.

According to the second modified preferred embodiment as described above, the other semiconductor chips 1 and 2 may be constructed in a manner similar to that of the semiconductor chip 3a or at least one of a plurality of semiconductor chips to be multi-layered may be constructed in a manner as described above.

THIRD MODIFIED PREFERRED EMBODIMENT

FIG. 9 is a longitudinal section view showing a semiconductor device according to a third modified preferred embodiment of the present invention. FIG. 9 shows a section of a part of a semiconductor chip 3b located in the uppermost layer of the semiconductor chips multi-layered on a mother board 40. The semiconductor device of the third modified preferred embodiment is constructed in a manner similar to that of the semiconductor device of the second modified preferred embodiment shown in FIG. 8 except for the following points.

(1) A through hole 61a which penetrates the insulating layer 306 is formed on the source electrode 308s of the transistor 308.

(2) A through hole conductor 71*a* for connecting the source electrode 308*s* with the grounding conductor 301*a* formed on the upper surface of the insulating layer 306 is formed in the through hole 61*a*. In the present case, the through hole conductor 71*a* has a sufficient thickness greater than those of the grounding conductor 303 and the grounding conductor 301 shown in FIG. 1 in a manner similar to that of the through hole conductor 71 of the second modified preferred embodiment.

The semiconductor device of the third modified preferred embodiment constructed as above has the same advantageous effect as that of the semiconductor device of the second modified preferred embodiment, and the source electrode 308*s* of the transistor 308 can be directly electrically connected to the grounding conductor 301*a*. Therefore, the distance between the source electrode 308*s* and the grounding conductor 301*a* can be remarkably reduced, and the grounding impedance can be reduced. Furthermore, since there is no need to form the grounding conductor 303 with a larger width, the semiconductor chip 3*b* can be made smaller than the semiconductor chip 3 of the preferred embodiment.

OTHER MODIFIED PREFERRED EMBODIMENTS

The semiconductor device of the above-mentioned preferred embodiment is constructed by laminating the three semiconductor chips 1, 2 and 3. However, the present invention is not limited to this, and two semiconductor chips or not less than four semiconductor chips may be multi-layered. Even with the above-mentioned construction, the semiconductor device has an advantageous effect similar to that of the above-mentioned preferred embodiments.

Furthermore, in the semiconductor device of the above-mentioned preferred embodiment, the insulating films 106, 107, 206, 207, 306 and 307 of the semiconductor chips 1, 2 and 3 are each constructed by laminating two dielectric films. However, the present invention is not limited to this, and each insulating film may be constituted by one dielectric film. With the above-mentioned arrangement, the construction of each semiconductor chip can be simplified.

Furthermore, in the semiconductor device of the above-mentioned preferred embodiment, the insulating films 106, 107, 206, 207, 306 and 307 of the semiconductor chips 1, 2 and 3 are each constructed by laminating two dielectric films. However, the present invention is not limited to this, and each insulating film may be constructed by laminating not less than three dielectric films. With the above-mentioned arrangement, by forming a circuit comprising conductors between the dielectric films and forming a grounding conductor on the surface of the dielectric film located in the outermost position away from the semiconductor substrate out of a plurality of multi-layered dielectric films, a higher density semiconductor device integrated further than the semiconductor device of the above-mentioned preferred embodiments can be constructed.

Furthermore, according to the semiconductor device of the preferred embodiment, a bump made of Au is used. However, the present invention is not limited to this, and a bump made of solder or the like may be used for the construction. Even with the above-mentioned construction, the semiconductor device has an advantageous effect similar to that of the above-mentioned preferred embodiments.

Furthermore, in the semiconductor device of the preferred embodiment, a circuit is formed on each of the upper surfaces and the lower surfaces of the semiconductor substrates 105, 205 and 305. However, the present invention is not limited to this, and a circuit may be formed on at least one surface (upper surface or lower surface). Even with the above-mentioned construction, the semiconductor device has an advantageous effect similar to that of the preferred embodiment.

The semiconductor device according to the first aspect of the present invention comprises:

a semiconductor substrate having two surfaces opposing to each other and having a circuit including a transistor having a plurality of electrodes, the circuit formed on at least one of said two surfaces;

insulating films respectively formed on the two surfaces of the semiconductor substrate;

connecting electrodes formed on a surface of the insulating film and electrically connected to the circuit; and a surface grounding conductor formed on a surface of each of the insulating films so as to cover the surface of each of the insulating films except for portions where the connecting electrodes are formed.

Therefore, any possible interference of the circuit formed on the semiconductor device with the external circuit can be prevented.

Furthermore, the semiconductor device of the second aspect of the present invention is constructed according to the semiconductor device of the first aspect, wherein the semiconductor device further comprises:

through holes respectively formed in the insulating films so as to penetrate the insulating films in a direction of thickness thereof;

through hole conductors respectively formed in the through holes; and an internal grounding conductor formed on the surface on which the circuit is formed so as to be located in a proximity of the transistor, wherein one electrode out of the plurality of electrodes of the transistor is electrically connected to the surface grounding conductor by way of the internal grounding conductor and the through hole conductor.

With this arrangement, heat generated at the transistor is transmitted to the surface grounding conductor by way of the internal grounding conductor and the through hole conductor and then discharged outwardly.

Furthermore, the semiconductor device of the third aspect of the present invention is constructed according to the semiconductor device of the second aspect, wherein the thickness of each of the through hole conductor and the surface grounding conductor is made greater than the thickness of the internal grounding conductor. Therefore, the heat generated at the transistor is efficiently transmitted to the surface grounding conductor by way of the internal grounding conductor and the through hole conductor and then efficiently discharged outwardly.

Furthermore, in the semiconductor device of the fourth aspect of the present invention, wherein the semiconductor device further comprises:

through holes respectively formed in the insulating films so as to penetrate the insulating films in a direction of thickness thereof; and through hole conductors respectively formed in the through holes, wherein one electrode out of the plurality of electrodes of the transistor is electrically connected to the surface grounding conductor by way of the through hole conductor.

With this arrangement, the heat generated at the transistor can be transmitted to the surface grounding conductor by way of the internal grounding conductor and the through hole conductor and then discharged to the outside, and the grounding impedance of the electrode of the transistor electrically connected to the surface grounding conductor can be reduced.

Furthermore, in the semiconductor device of the fifth aspect of the present invention, the thickness of each of the through hole conductor and the surface grounding conductor is made greater than the thickness of a plurality of electrodes of the transistor. Therefore, the heat generated at the transistor can be efficiently transmitted to the surface grounding conductor by way of the internal grounding conductor and the through hole conductor and then efficiently discharged to the outside, and the grounding impedance of the electrode of the transistor electrically connected to the surface grounding conductor can be reduced.

Furthermore, in the semiconductor device of the sixth aspect of the present invention, each of the insulating films is constructed by laminating a plurality of dielectric films, wherein an electrode constituting at least a part of the circuit including the transistor is disposed between a plurality of dielectric films, and wherein each of the connecting electrodes and the surface grounding conductor is disposed on a surface of a dielectric film located in an outermost position away from the semiconductor substrate out of a plurality of dielectric films.

With this arrangement, the circuit including the transistor is allowed to have a higher density than in the case where the insulating film is constituted by one dielectric film.

Furthermore, in the semiconductor device of the seventh aspect of the present invention, the circuit including the transistor is formed on each of the two surfaces of the semiconductor substrate. Therefore, the circuit including the transistor is allowed to have a higher density than in the case where the circuit is formed on only one surface of the semiconductor substrate.

Furthermore, the semiconductor device of the eighth aspect of the present invention is constructed according to the semiconductor device of the seventh aspect, wherein the semiconductor device further comprises:

a further through hole formed in the semiconductor substrate so as to penetrate the semiconductor substrate in a direction of thickness of the semiconductor substrate; and a further through hole conductor formed in the further through hole, wherein respective ones of electrodes of the two circuits including the transistor formed on both surfaces of the semiconductor substrate are electrically connected to each other by way of the further through hole conductor.

With this arrangement, the two circuits including the transistor can be electrically connected with each other easily in an arbitrary position.

Furthermore, the multi-layered type semiconductor apparatus of the ninth aspect of the present invention comprise a plurality of semiconductor devices, each of the semiconductor devices formed on a semiconductor substrate, a plurality of semiconductor devices laminated in a direction of thickness of each of the semiconductor substrates, wherein each of a plurality of semiconductor devices comprises:

the semiconductor substrate having two surfaces opposing to each other and having a circuit including a transistor having a plurality of electrodes, the circuit formed on at least one of the two surfaces;

insulating films respectively formed on the two surfaces of the semiconductor substrate;

connecting electrodes formed on a surface of the insulating film and electrically connected to the circuit; and a surface grounding conductor formed on a surface of each of the insulating films so as to cover the surface of each of the insulating films except for portions where the connecting electrodes are formed, wherein the multi-layered type semiconductor apparatus further comprises:

connection means for electrically connecting the surface grounding conductors of adjoining ones of the semiconductor devices with each other.

Therefore, in comparison with the prior art, any possible interference of the circuits of the multi-layered semiconductor devices can be prevented, a circuit capable of operating at a high frequency can be constructed with a higher density, and a thin multi-layered type semiconductor device can be provided.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device, comprising:

a semiconductor substrate having two surfaces opposing to each other and having a circuit including a transistor having a plurality of electrodes, said circuit formed on at least one of said two surfaces;

insulating films respectively formed on said two surfaces of said semiconductor substrate;

connecting electrodes formed on a surface of said insulating film and electrically connected to said circuit;

a surface grounding conductor formed on a surface of each of said insulating films so as to cover the surface of each of said insulating films except for portions where said connecting electrodes are formed;

through holes respectively formed in said insulating films so as to penetrate said insulating films in a direction of thickness thereof;

through hole conductors respectively formed in said through holes; and an internal grounding conductor formed on the surface on which said circuit is formed, wherein one electrode out of said plurality of electrodes of said transistor is electrically connected to said surface grounding conductor by way of said internal grounding conductor and said through hole conductor, wherein each of said through hole conductor and said surface grounding conductor has a thickness greater than a thickness of said internal grounding conductor, and wherein the thickness of said through hole conductors and said surface grounding conductor efficiently transmits heat from the transistor to outside the semiconductor device.

2. The semiconductor device as claimed in claim 1, wherein each of said insulating films is constructed by laminating a plurality of dielectric films, wherein an electrode constituting at least a part of said circuit including said transistor is disposed between said plurality of dielectric films, and wherein each of said connecting electrodes and said surface grounding conductor is disposed on a surface of a dielectric film located in an outermost position away from said semiconductor substrate out of said plurality of dielectric films.

3. The semiconductor device as claimed in claim 1, wherein said circuit including said transistor is formed on each of said two surfaces of said semiconductor substrate.

4. The semiconductor device as claimed in claim 3, further comprising:

a further through hole formed in said semiconductor substrate so as to penetrate said semiconductor substrate in a direction of thickness of said semiconductor substrate; and a further through hole conductor formed in said further through hole, wherein respective ones of electrodes of said two circuits including said transistor formed on both surfaces of said semiconductor substrate are electrically connected to each other by way of said further through hole conductor.

5. A multi-layered type semiconductor apparatus comprising: a plurality of semiconductor devices, each of said semiconductor devices formed on a semiconductor substrate, said plurality of semiconductor devices laminated in a direction of thickness of each of said semiconductor substrates, wherein each of said plurality of semiconductor devices comprises:

said semiconductor substrate having two surfaces opposing to each other and having a circuit including a transistor having a plurality of electrodes, said circuit formed on at least one of said two surfaces;

insulating films respectively formed on said two surfaces of said semiconductor substrate;

connecting electrodes formed on a surface of said insulating film and electrically connected to said circuit;

a surface grounding conductor formed on a surface of each of said insulating films so as to cover the surface of each of said insulating films except for portions where said connecting electrodes are formed;

through holes respectively formed in said insulating films so as to penetrate said insulating films in a direction of thickness thereof;

through hole conductors respectively formed in said through holes; and an internal grounding conductor formed on the surface on which said circuit is formed, wherein said multi-layered type semiconductor apparatus further comprises:

connection means for electrically connecting the surface grounding conductors of adjoining ones of said semiconductor devices with each other, wherein one electrode out of said plurality of electrodes of said transistor is electrically connected to said surface grounding conductor by way of said internal grounding conductor and said through hole conductor, wherein each of said through hole conductor and said surface grounding conductor has a thickness greater than a thickness of said internal grounding conductor, and wherein the thickness of said through hole conductors and said surface grounding conductor efficiently transmits heat from the transistor to outside the semiconductor device.

* * * * *

UNITED STATES PATENT AND TRADEMARK OFFICE
CERTIFICATE OF CORRECTION

PATENT NO : 5,825,080
DATED : October 20, 1998
INVENTOR(S) : T. IMAOKA et al.

It is certified that error appears in the above-identified patent and that said Letters Patent is hereby corrected as shown below:

Title page item [56], change "3,489,954" to -- 3,489,953 --

Signed and Sealed this

Fourteenth Day of September, 1999

Attest:

Q. TODD DICKINSON

Attesting Officer            Acting Commissioner of Patents and Trademarks